United States Patent [19]
Taylor et al.

[11] Patent Number: 5,508,700
[45] Date of Patent: Apr. 16, 1996

[54] CAPACITANCE SENSITIVE SWITCH AND SWITCH ARRAY

[75] Inventors: Thomas M. Taylor, West Vancouver; Mitchell G. Burton, Burnaby, both of Canada

[73] Assignee: Tanisys Technology, Inc., Austin, Tex.

[21] Appl. No.: 214,265

[22] Filed: Mar. 17, 1994

[51] Int. Cl.[6] .................................................. H03K 17/96
[52] U.S. Cl. ............................ 341/33; 341/26; 200/600; 324/678
[58] Field of Search .................................. 341/33, 22, 26; 200/600; 340/870.37; 324/662, 671, 678; 307/116, 652

[56] References Cited

U.S. PATENT DOCUMENTS

| | | | |
|---|---|---|---|
| 3,846,791 | 11/1974 | Foster | 341/33 |
| 3,958,239 | 5/1976 | Green | 341/33 |
| 4,017,747 | 4/1977 | Sheng | 307/293 |
| 4,145,748 | 3/1979 | Eichelberger et al. | 364/862 |
| 4,157,539 | 6/1979 | Hunts et al. | 340/365 C |
| 4,291,303 | 9/1981 | Cutler et al. | 340/711 |
| 4,305,135 | 12/1981 | Dahl et al. | 341/33 |
| 4,352,141 | 9/1982 | Kent | 307/652 |
| 4,495,485 | 1/1985 | Smith | 340/365 C |
| 4,561,002 | 12/1985 | Chiu | 341/33 |
| 4,567,470 | 1/1986 | Yoshikawa et al. | 340/365 C |
| 4,595,913 | 6/1986 | Aubuchon | 340/365 C |
| 4,728,931 | 3/1988 | Linder et al. | 341/33 |
| 4,728,932 | 3/1988 | Atherton | 341/33 |
| 4,772,874 | 9/1988 | Hasegawa | 340/365 S |
| 4,831,279 | 5/1989 | Ingraham | 307/116 |
| 4,939,382 | 7/1990 | Gruodis | 307/116 |
| 5,012,124 | 4/1991 | Hollaway | 307/116 |
| 5,021,740 | 6/1991 | Sarr et al. | 324/687 |
| 5,367,198 | 11/1994 | Buerget et al. | 307/116 |

Primary Examiner—John K. Peng
Assistant Examiner—Daniel J. Wu
Attorney, Agent, or Firm—Richards, Medlock & Andrews

[57] ABSTRACT

A capacitance-sensitive switch unit including a capacitive element operable to produce an effective capacitance dependent upon the physical proximity of objects relative thereto, a first selector signal input connected to the capacitive element to enable a first input signal to charge the effective capacitance, a threshold signal producing circuit connected to the capacitive element, for producing a threshold signal which is rendered active when the effective capacitance charges to a pre-defined potential, a switching circuit for selectively connecting the capacitive element to the threshold signal producing circuit in response to a switching signal and a discharge control circuit connected to the capacitive element, for selectively discharging the effective capacitance independently of the input signal, in response to a discharge signal. Also disclosed is a switch array employing structure similar to the above.

64 Claims, 5 Drawing Sheets

CAPACITANCE SENSITIVE SWITCH AND SWITCH ARRAY

BACKGROUND OF THE INVENTION

This invention relates to capacitance sensitive switches and capacitance sensitive switch arrays.

Capacitance sensitive switches currently exist in the art. They generally can be classified as either relating to frequency shift detecting circuits, to voltage divider circuits or to Resistance-Capacitance (RC) timing circuits.

Frequency shift detecting circuits are disclosed in U.S. Pat. No. 4,495,485 to Smith and U.S. Pat. No. 4,567,470 to Yoshikawa et al. Smith employs a network of capacitive devices which include sensing areas on a keyboard. The network presents a equivalent capacitance to an RC circuit which ultimately determines an oscillation frequency of an oscillator employing a 555 timer. Detection of the shift in oscillating frequency of the 555 timer is used to determine whether or not an object is in proximity to a sensing area.

U.S. Pat. No. 4,567,470 to Yoshikawa et al., discloses sensing plates connected to an analogue multiplexer which ultimately connects each plate to an oscillator circuit. A compensating circuit is connected to the multiplexer to compensate each plate capacitance to cause the oscillator to oscillate at the resonance frequency when no plate is touched. A comparator senses the average voltage level at an output of the oscillator. When a plate is touched, body capacitance shifts the frequency of oscillation causing a drop in voltage level which is detected by the comparator. The comparator gates the loading of registers with an address value representing the particular plate touched. Generally, the complexity of the circuitry required to detect changes in frequency due to capacitance is high in the above two devices.

Furthermore, there appears to be no ability to quickly and easily recalibrate the reference frequency of oscillation without modifying these circuits.

Voltage divider circuits are disclosed in U.S. Pat. Nos. 5,012,124 to Hollaway, 4,291,303 to Cutler et al., 4,145,748 to Eichelberger et al. and 4,772,874 to Hasegawa. The patent to Hollaway discloses a plurality of plates which are all activated at the same time by a common oscillator signal. A voltage divider is formed by a fixed resistor and capacitance of a human body touching a plate, creating a drop in voltage which is rectified and filtered to a DC value which is converted into a digital form. A high or low DC value relative to a previously stored reference value indicates the on/off condition of a signal line representing the condition of the switch. The signal lines are multiplexed and interpreted by a microprocessor. The external multiplexer and analog to digital converter add unnecessary complexity and cost to this circuit.

The patent to Cutler et al., discloses a plurality of capacitive coupling devices which couple a signal through the capacitance of a user's finger to signal ground. The patent states that the scan signal voltage is reduced by about 20% due to such coupling. This drop in voltage is buffered and applied to an RC circuit which produces an output voltage which is compared to a threshold voltage and is used to trigger a comparator if the output voltage is below the threshold voltage, as would be the case if a plate were touched. Additional circuitry is required to overcome the effects of coupling the capacitance of the user's finger into more than one coupling device.

The patent to Eichelberger et al., discloses a capacitive keyboard array including a plurality of key plates which couple the capacitance of an operator's finger to signal ground to effect a voltage divider. The effect is that a signal having a voltage level dependent on the proximity of the user's finger to the plate is created and supplied to an analog to digital (A/D) converter which compares a digital value representing the signal to a previously stored reference value. The output of the comparator indicates the touched and untouched states of the plate. The reference value is periodically updated by incrementing or decrementing a counter into which the reference value is loaded. This suggests additional circuitry.

The patent to Hasegawa discloses a keyboard which has depressible keys. The keys capacitively couple a clock signal from a column line to a row line and produce a signal on the row line having a pulse width defined by the time between pressing and releasing the key. The greater the depth of depression of a key, the greater the pulse width. Detection of the pulse width is used to determine whether or not a key is depressed. Thus a user must keep a key depressed for a required period of time in order to activate a given key.

Resistance-Capacitance timing circuits are disclosed in U.S. Pat. No. 4,595,913 to Aubuchon and in U.S. Pat. No. 4,157,539 to Hunts et al. Aubuchon discloses a plurality of asynchronous sensing circuits, each operable to receive a clock pulse from a common clock. Each sensing circuit receives and inverts the clock pulse to present a low voltage level to an RC network, the C of which is formed by the user's finger. The voltage level of a digital signal produced by a NAND gate connected to the RC network is then clocked into a D flip-flop after a pre-specified or reference time, the output of the D flip-flop representing true and false states of the touched condition.

The patent to Hunts et al., discloses a plurality of coupling devices connected between signal lines. Proximity of the user's finger to a plate couples both signal lines to ground. Each of the signal lines is then set high sequentially which initiates a charging cycle in a first RC network including the user's finger and in a second RC network including a reference capacitor. Depending upon which RC network achieves a desired voltage level first, a flip-flop is set to indicate the presence or absence of the user's finger on the plates corresponding to the actuated signal lines.

The problem with the above RC timing devices is that they each employ a common reference capacitance for comparison with a number of switch units. Consequently, some switch units may be more sensitive than others due to variances in capacitance caused by circuit board layout. This can have adverse effects on the ability to detect objects in physical proximity with the sensing means and false activation of the switch is more likely.

What would be desirable is a capacitance sensitive switch array in which each switch unit is individually selectable and in which a digital timer is used to produce a timer value indicating the time taken to charge the capacitance of a selected switch unit and in which the digital timer value is compared to a corresponding digital reference timer value representing the timer value produced by the selected switch unit when no external influence is applied, to produce a signal indicating the on/off condition of the switch unit. In this manner each switch unit can have a separate reference timer value.

SUMMARY OF THE INVENTION

In accordance with one aspect of the invention there is provided a capacitance-sensitive switch unit including a capacitive element operable to produce an effective capacitance dependent upon the physical proximity of objects relative thereto, a first selector signal input connected to the capacitive element to enable a first input signal to charge the effective capacitance, a threshold signal producing circuit connected to the capacitive element, for producing a threshold signal which is rendered active when the effective capacitance charges to a pre-defined potential, a switching circuit for selectively connecting the capacitive element to the threshold signal producing circuit in response to a switching signal and a discharge control circuit connected to the capacitive element, for selectively discharging the effective capacitance independently of the input signal, in response to a discharge signal.

Preferably, the threshold signal producing circuit includes a buffer circuit for producing a developed potential representing the potential at the capacitive element without substantially loading the capacitive element.

Preferably, the buffer circuit includes an emitter follower circuit including an impedance across which the developed potential is produced.

Preferably, the threshold signal producing circuit includes a switching element for rendering active the threshold signal when the developed potential is greater than a representative potential representative of the pre-defined potential.

Preferably, the switching element includes a schmitt trigger circuit for reducing false activation of the threshold circuit.

Preferably, the apparatus includes a switch unit control circuit for producing the input signal, the switching signal and the discharge signal to cause the threshold signal producing circuit to render active the threshold signal a period of time after the discharge signal is rendered inactive, the period of time being dependent upon the effective capacitance.

Preferably, the switch control circuit includes a timer for producing a timer value indicative of the period of time.

Preferably, the switch control circuit includes a switch status signal producing circuit for rendering active a switch status signal when the timer value is greater than a stored timer value.

Preferably, the stored timer value represents the timer value obtained when no objects are in close physical proximity to the capacitive element.

Preferably, the apparatus further includes a storage circuit for storing the timer value produced when no objects are in close physical proximity to the capacitive element.

Preferably, the switch unit control circuit includes a timer value accumulator for accumulating the timer values produced over a succession of periods of time to produce an accumulated timer value.

Preferably, the switch control circuit includes a switch status signal producing circuit for rendering active a switch status signal when the accumulated timer value is greater than an accumulated stored timer value.

Preferably, the accumulated stored timer value represents the accumulated timer value obtained after a succession of periods of time, when no objects are in close physical proximity to the capacitive element.

Preferably, the apparatus includes a storage circuit for storing the accumulated timer value produced when no objects are in close physical proximity to the capacitive element.

Preferably, the switch unit control circuit includes a microprocessor and the storage circuit includes a memory register.

In accordance with another aspect of the invention there is provided a method of operating a capacitance-sensitive switch unit, the method comprising the steps of producing an effective capacitance in a capacitive element having an effective capacitance dependent on the physical proximity of objects relative thereto, charging the effective capacitance with a first selector signal, selectively connecting the capacitive element to a threshold signal producing circuit in response to a switching signal, rendering active a threshold signal when the effective capacitance charges to a pre-defined voltage, and selectively discharging the effective capacitance independently of the input signal, in response to a discharge signal.

In accordance with another aspect of the invention there is provided a switch array comprising, a plurality of selectable capacitance-sensitive switch units, each switch unit including a capacitive element operable to produce a respective effective capacitance dependent upon the physical proximity of objects relative thereto, a charging circuit for selectively charging the effective capacitance of each switch unit, each respective effective capacitance having a respective charging time dependent on the respective effective capacitance, a timer cooperating with the charging circuit for producing a timer value indicative of the period of time taken to charge a selected capacitive element from a first pre-defined potential to a second pre-defined potential and a switch status signal producing circuit cooperating with the timer to produce a switch status signal for a selected switch element, the switch status signal being indicative of the physical proximity of an object relative to the selected capacitive element, the switch status signal producing circuit comparing the timer value with a corresponding reference timer value and rendering the switch status signal active when the timer value is greater than the corresponding reference timer value and rendering the switch status signal inactive when the timer value is equal to or less than the corresponding reference timer value.

Preferably, the apparatus further includes a threshold signal producing circuit for producing a threshold signal when the effective capacitance of the selected switch unit charges to a pre-defined potential.

Preferably, the threshold signal producing circuit includes a buffer circuit for producing a developed potential representing the potential at the selected capacitive element without substantially loading the selected capacitive element.

Preferably, the buffer circuit includes an emitter follower circuit including an impedance across which the developed potential is produced.

Preferably, the threshold signal producing circuit includes a switching element connected to the impedance for rendering active the threshold signal when the developed potential is greater than a representative potential representative of the pre-defined potential.

Preferably, the apparatus includes a discharge control circuit connected to a common node, for selectively discharging the effective capacitance of the selected capacitive element in response to a discharge signal.

Preferably, the discharge control circuit includes a discharge node and a diode connected in series, between the common node and the discharge node, the discharge node having a potential controlled by the discharge signal.

Preferably, the apparatus includes a switch unit control circuit for providing an input selector signal operable to charge the effective capacitance of a desired switch unit, for providing the switching signal and for providing the discharge signal to cause the threshold signal producing circuit to render active the threshold signal a period of time after the discharge signal is rendered inactive, the period of time being dependent upon the effective capacitance.

Preferably, the switch control circuit includes a microprocessor having outputs operable to produce the input selector signal, the switching signal and the discharge signal, having an input for receiving the threshold signal, and having a program including execution codes for implementing the timer and for causing the switch status signal to be produced.

Preferably, the switch control circuit also includes a storage circuit for storing a corresponding reference timer value for each switch unit.

Preferably, a given corresponding reference timer value represents the timer value obtained when no objects are in close physical proximity to the corresponding capacitive element.

Preferably, the switch unit control circuit includes a timer value accumulator for accumulating the timer values produced over a succession of periods of time to produce an accumulated timer value.

Preferably, the apparatus includes a storage circuit for storing a corresponding reference accumulated timer value for each switch unit, each reference accumulated timer value representing the accumulated timer value produced when no object is in close physical proximity to the corresponding capacitive element.

Preferably, the switch control circuit renders active the switch status signal when the accumulated timer value of a selected switch unit is greater than its corresponding reference accumulated timer value.

Preferably, the switch unit control circuit includes a microprocessor and the storage circuit includes a memory register.

In accordance with another aspect of the invention there is provided a method of operating a capacitance-sensitive switch array, the method comprising the steps of sequentially charging respective effective capacitances of a plurality of addressable capacitance sensitive switch units each having a capacitive element operable to produce a respective effective capacitance dependent upon the physical proximity of objects relative thereto, each respective effective capacitance having a respective charging time dependent on the respective effective capacitance, producing a plurality of respective timer values indicative of the time taken to charge each respective capacitive element from a first pre-defined potential to a second pre-defined potential, comparing each respective timer value with a respective reference timer value and rendering a switch status signal active when the respective timer value is greater than the reference timer value and rendering the switch status signal inactive when the timer value is equal to or less than the respective reference timer value.

BRIEF DESCRIPTION OF THE DRAWINGS

In drawings which illustrate embodiments of the invention.

DETAILED DESCRIPTION

FIG. 1

Figure 1:
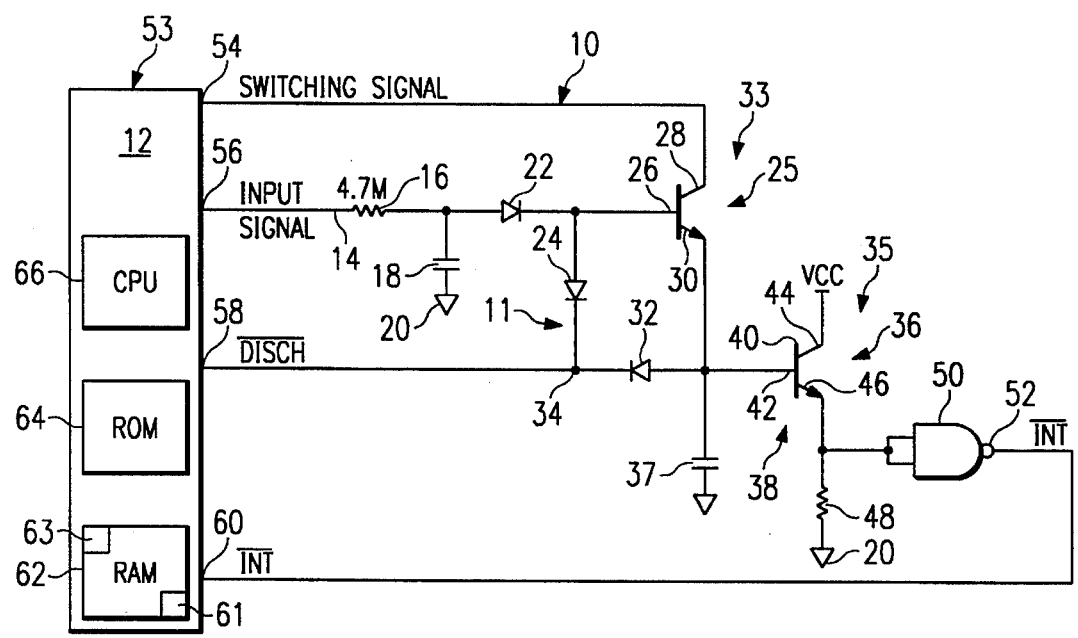
FIG. 1 is a schematic diagram of a switch unit according to a first embodiment of the invention.

Referring to FIG. 1, a capacitance-sensitive switch unit circuit according to a first embodiment of the invention is shown generally at 10. The switch unit 10 is connected to a switch unit control circuit 12 which supplies control signals and which receives an interrupt signal from the switch unit.

The switch unit 10 includes a capacitive element 18, a first selector signal input 14, a threshold signal producing circuit 35, a switching circuit 33 and a discharge control circuit 11. The first selector signal input 14 is connected to a first resistor 16 and is operable to receive a first selector signal from the control circuit 12. The first resistor is further connected to the capacitive element, which in this embodiment is a plate 18. In this embodiment, the plate 18 is a square sheet conductor formed as a square conductor trace on a conventional printed wiring board. The plate has an effective capacitance relative to signal ground 20 and therefore acts as the capacitive element in the apparatus. The first resistor and the capacitive element act as a resistance-capacitance (RC) timing circuit and therefore, the first selector signal input may be said to be connected to the capacitive element to enable a first signal to charge the effective capacitance.

The effective capacitance the plate presents to the circuit depends upon the coupling of the plate to signal ground, which is dependent upon parasitic capacitive coupling of the plate to nearby objects. Thus, when an object is placed in close proximity to the plate, the effective capacitance may be increased if the object enhances the capacitive coupling of the plate to signal ground. Such is the case when a human places a finger in close proximity to the plate, in which case, the coupling of the plate to signal ground is increased as the finger is placed nearer the plate. Hence, the effective capacitance which the plate presents to the circuit is also increased. With no objects in proximity with the plate 18, the effective capacitance is approximately 20 pf. In effect, the capacitive element is operable to produce an effective capacitance dependent upon the physical proximity of objects relative thereto.

Further connected to the first resistor 16 and the plate 18 is a first diode 22 to which is connected a second diode 24 and the switching circuit 33. The switching circuit includes a first transistor 25 having a base terminal 26, a collector terminal 28 and an emitter terminal 30. The first and second diodes are connected to the base 26 and thereby serve to connect the base to the capacitive element. The collector is connected to the control circuit 12 to receive a switching signal and the emitter is connected to the threshold signal producing circuit 35. The first transistor 25 effectively acts as a switching circuit for selectively connecting the capacitive element to the threshold signal producing circuit 35 in response to a switching signal received at the collector 28 from the control circuit 12.

The emitter 30 of the transistor 25 is connected to a third diode 32 which is further connected to the second diode 24 to form a discharge node 34 which is operable to receive an active-low discharge signal from the control circuit 12. The first, second and third diodes act as the discharge control circuit 11 connected to the capacitive element, for selectively discharging the effective capacitance independently of the input signal, in response to the discharge signal appearing at the discharge node. The discharge node thus has a potential controlled by the discharge signal.

The emitter 30 is further connected to a swamping capacitor 37 and to the threshold signal producing circuit 35. The swamping capacitor 37 swamps the capacitance of the third diode 32 to reduce any effects it may have and the threshold signal producing circuit 35 produces a threshold signal which is rendered active when the effective capacitance charges to a pre-defined potential. The threshold signal producing circuit 35 includes a buffer circuit 36, which produces a developed potential representing the potential at the capacitive element, without substantially loading the capacitive element. The buffer circuit includes an emitter follower circuit shown generally at 38, including a second transistor 40 having a base terminal 42, a collector terminal 44 and an emitter terminal 46. The base terminal is connected to the emitter 30 of the first transistor 25, the collector 44 is connected to a Vcc power supply line and the emitter terminal 46 is connected to a second resistor 48 which is further connected to signal ground 20. The second resistor acts as an impedance across which the developed potential is produced.

Also connected to the emitter 46 is a switching element, which in this embodiment is a schmitt trigger NAND gate 50 wired as an inverter. The NAND gate has an output 52 for producing an interrupt signal (INT) which is received by the control circuit 12. Effectively, therefore, the NAND gate acts as a switching element for rendering active the threshold signal (INT) when the developed potential is greater than a representative potential, representative of the pre-defined potential. A schmitt trigger NAND gate has been used as the switching element to reduce false activation of the threshold circuit and because the schmitt inputs define the pre-defined potential. Switching therefore occurs positively at voltage levels predetermined in the manufacture of the device, as is generally known with schmitt inputs.

In this embodiment, the switch unit control circuit includes a microprocessor 53 having first, second and third outputs 54, 56 and 58 respectively for producing the switching signal, the input signal and the discharge signal respectively to cause the threshold signal producing circuit 35 to render active the threshold signal a period of time after the discharge signal is rendered inactive, the period of time being dependent upon the effective capacitance. The first output 54 is connected to the collector 28 of the first transistor 25, the second output 56 is connected to the first selector signal input 14 and the third output 58 is connected to the discharge node The microprocessor 53 also has an input 60 which is connected to the output 52 of the NAND gate 50, for receiving the interrupt signal, or threshold signal (INT).

The microprocessor 53 includes a conventional Random Access Memory (RAM) 62, a conventional Read Only Memory (ROM) 64 and a conventional Central Processing Unit (CPU) 66. The ROM includes a program including execution codes which are operable to direct the microprocessor to issue the switching signal, the input signal and the discharge signal in such a manner that the interrupt signal (INT) is received. To achieve this, the program includes an output sequencing routine, a timer routine, and a comparison routine, all described with reference to FIG. 2.

FIG. 2

Figure 2:
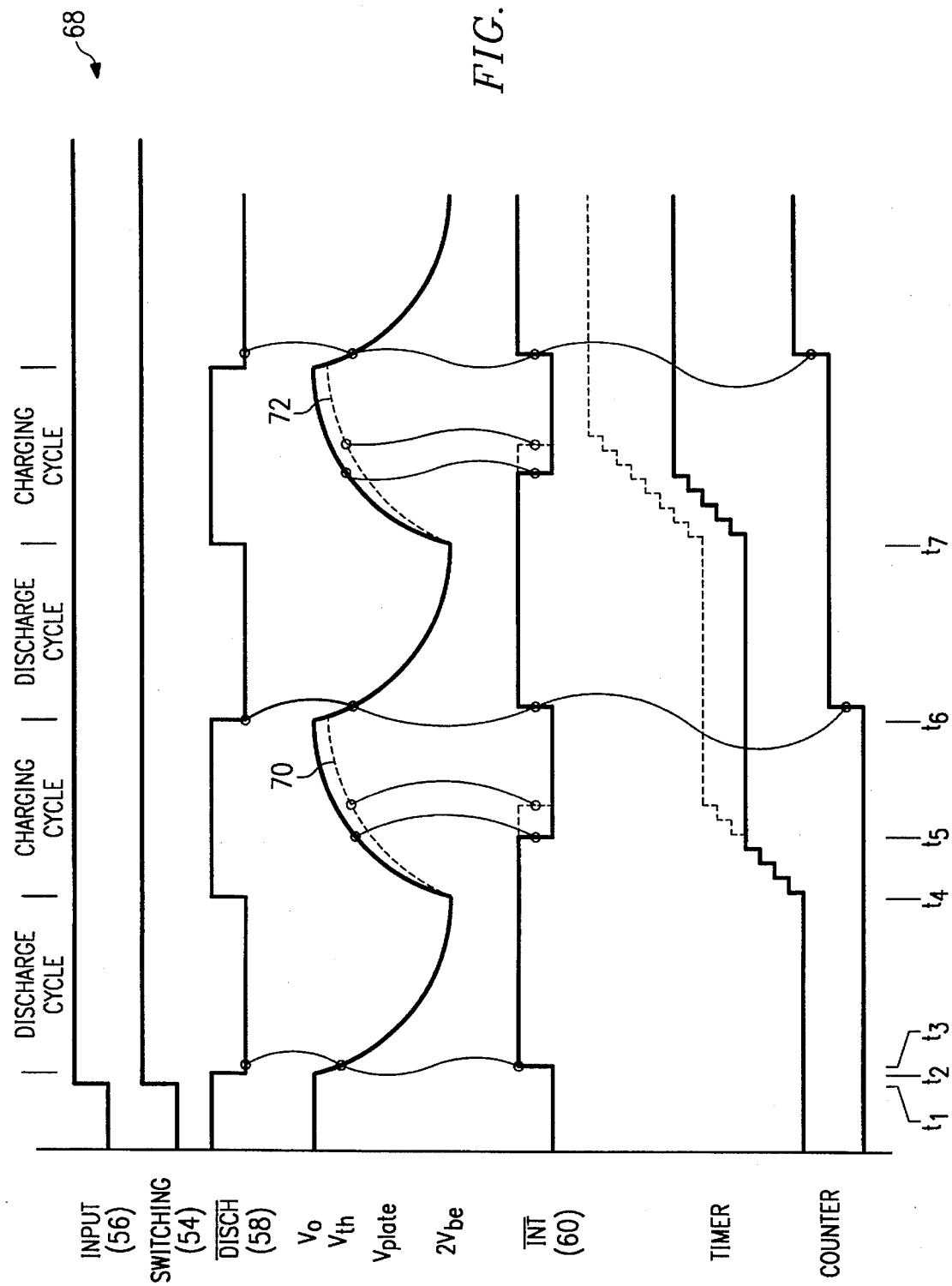
FIG. 2 is a timing diagram illustrating timing relationships between signals occurring on various signal lines shown in the schematic diagram of FIG. 1.

Referring to FIG. 2, a timing diagram illustrating the operation of the circuit of FIG. 1 is shown generally at 68.

Referring to FIGS. 1 and 2, the program causes the microprocessor 53 to render the input signal and the switching signal active high at time t1. The input signal is operable to charge the effective capacitance while the switching signal is operable to cause the switching circuit to selectively connect the capacitive element to the threshold signal producing circuit.

Discharge cycle

At time t2, shortly after time t1, the program causes the microprocessor to render the discharge signal active (low) which brings low the potential at the discharge node 34 of FIG. 1, thereby creating a low impedance path for any charge on the plate 18 to flow through the first and second diodes 22 and 24 and into the third output 58. Referring back to FIG. 2, the discharge signal is held low for a period of time long enough to permit any charge on the effective capacitance to be drained off. This period of time will depend upon the effective capacitance of the plate and the resistance in the path between it and signal ground. Generally, it has been found that 5 milliseconds provides enough time to drain the effective capacitance.

Upon setting the discharge signal low, the voltage on the plate is seen to decrease exponentially as shown between time periods t3 and t4. As the voltage decreases, it passes through a threshold value Vth which represents the voltage at the plate, corresponding to the voltage at which the schmitt trigger NAND gate 50 of FIG. 1 changes state when the voltage at its input is decreasing. Thus, referring to FIG. 1, the interrupt signal appearing at the output 52 is rendered high (inactive) as seen at time t3, in FIG. 2. During this time, the voltage at the plate be drops to a value which is two diode drops 2 Vbe (the diode drops of the first and second diodes) above signal ground.

Charging Cycle

Referring back to FIG. 2, at time t4, approximately 5 milliseconds from time t3, the program causes the microprocessor to render the discharge signal high which permits the effective capacitance to begin charging from the voltage of 2 Vbe (approx. 1.4 volts) toward the voltage of the input signal Vo. When the discharge signal is rendered high, the program activates a timer routine which begins incrementing as the voltage on the plate be of FIG. 1 rises, this incrementing being illustrated on the timer line in FIG. 2. The timer routine is operable to provide a timer value indicative of the period of time taken to charge the effective capacitance. When the voltage at the plate reaches the threshold voltage Vth, as seen at t5, the NAND gate 50, of FIG. 1, renders the interrupt signal (INT0) active (low). The low interrupt signal is received by the microprocessor and the program stops the timer routine. While the discharge signal remains high, the plate continues to charge to Vo.

At time t6, approximately 5 milliseconds from time t5, the program causes the microprocessor to render the discharge signal active (low) again which initiates the discharge cycle as described above. This second discharge cycle is completed at time t7, at which point the charging cycle as seen between timer t4 and t6 is repeated. However, the timer is not reset after each charging cycle but rather accumulates count values from successive charging cycles until ten charging cycles have been completed. Thus, the timer routine includes an accumulator routine which accumulates the timer values produced over a succession of charging cycles, to produce an accumulated timer value.

To determine how many charging cycles have been completed, the program implements a cycle counter which is incremented upon the completion of each charging cycle as seen on the counter line of FIG. 2. The contents of the cycle counter are compared to the number ten and if equal to ten, it is assumed that enough timer values have been acquired to make a judgement as to whether or not an object is in physical proximity with the plate 18. The number ten is arbitrary and could be any number greater than 0. The greater the number, the greater the accuracy of the device.

It will be appreciated that the effective capacitance of the plate is increased when an object is in physical proximity with the plate, which causes the effective capacitance to take more time to charge as indicated in broken outline at 70 and 72. This results in the interrupt signal being rendered active (low) later than it otherwise would be, which permits the timer to acquire a larger incremental timer value with each charging cycle as illustrated in broken outline on the timer line in FIG. 2. Consequently, when an object is in close physical proximity to the plate 18, the accumulated timer value is greater than it would be if no object were in close physical proximity as indicated in solid outline on the timer line. Therefore, in order to determine whether or not an object is in close physical proximity to the plate, the program stores the accumulated timer value acquired when no object is in close physical proximity to the plate 18, as a reference accumulated value. Storage of the reference accumulated value is achieved by writing to a memory register 61 of the RAM 62, which acts as a storage circuit. The program then uses this reference accumulated value for comparison against any subsequently acquired accumulated timer value in which case if the subsequently acquired accumulated timer value is excessively greater than the reference accumulated timer value, the program renders active a switch status signal to indicate that there is an object in close physical proximity with the plate 18. Similarly, if the subsequently acquired accumulated timer value is approximately equal to the reference accumulated timer value, the program renders inactive the switch status signal to indicate that no object is in close physical proximity with the plate 18. Numerical values for the terms excessively greater and approximately equal are matters of choice and are best kept user-definable. However, a range of about 20% has been used in the embodiment described.

Referring to FIG. 1, in this embodiment, the switch status signal is represented by a 1 or 0 written to a switch status register 63 in the RAM 62 of the microprocessor, where 1 means an object is in close physical proximity with the plate and 0 means no objects are in close physical proximity with the plate. Thus it may be said that the switch control unit includes a switch status signal producing circuit (the microprocessor) for rendering active a switch status signal when the timer value is greater than the stored timer value.

Figure 3:
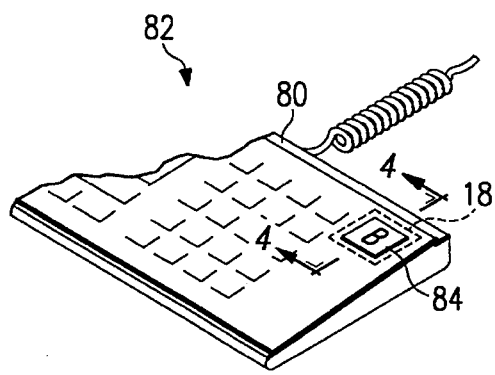
FIG. 3 is a partial perspective view of a conventional computer keyboard to which is secured a plate according to the first embodiment of the invention.
Figure 4:
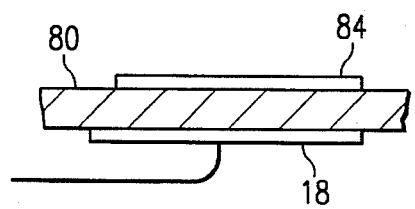
FIG. 4 is a cross sectional view of a portion of the conventional computer keyboard of FIG. 3, taken along lines 4—4.

It will be appreciated that the plate 18, according to the invention, can be mounted in a variety of locations since actual physical contact of an object with the plate is not required. Rather, sufficient proximity to change the effective capacitance of the plate is all that is required. Actual distances of objects relative to the plate will depend upon the area of the plate, the area of the object, and the dielectric constant of the material between the plate and the object. FIGS. 3 and 4

Referring to FIGS. 3 and 4, since physical contact of the object with the plate is not necessary, the plate 18 can be conveniently mounted under the shell 80 of a conventional computer keyboard 82 and indicia 84, in the form of a sticker, for example, can be placed on top of the shell, above the plate. With this configuration, the user need only touch the indicia 84 with a finger to change the status of the switch signal.

Generally, the operation of the circuit may be broadly stated to be a method of operating a capacitance-sensitive switch unit, the method comprising the steps of producing an effective capacitance in a capacitive element having an effective capacitance dependent on the physical proximity of objects relative thereto, charging the effective capacitance with a first selector signal, selectively connecting the capacitive element to a threshold signal producing circuit in response to a switching signal, rendering active a threshold signal when the effective capacitance charges to a predefined voltage and selectively discharging the effective capacitance independently of the input signal, in response to a discharge signal.

Second Embodiment

FIG. 5

Figure 5A:
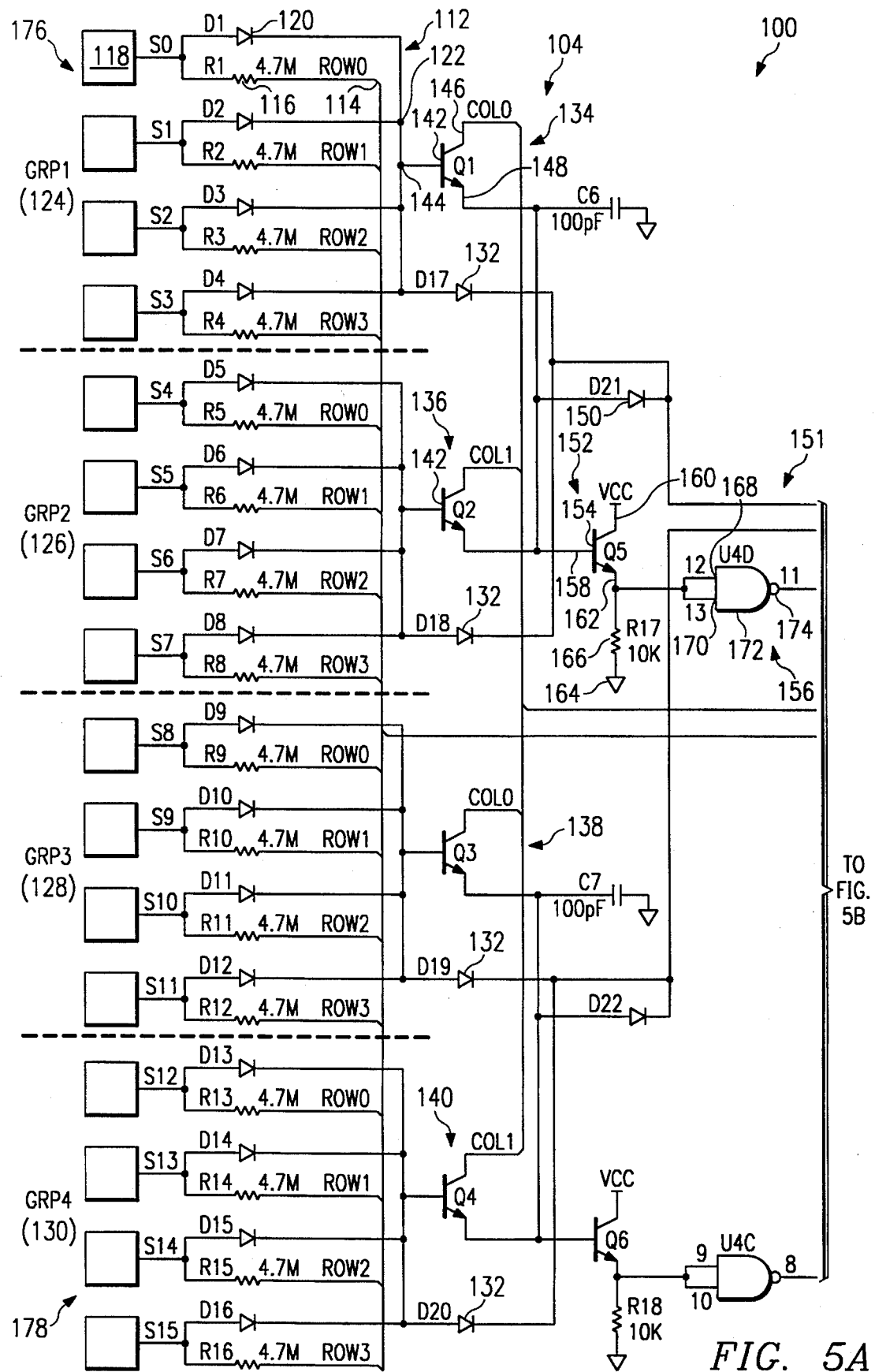
FIG. 5 is a schematic diagram of a switch array according to a second embodiment of the invention.
Figure 5B:
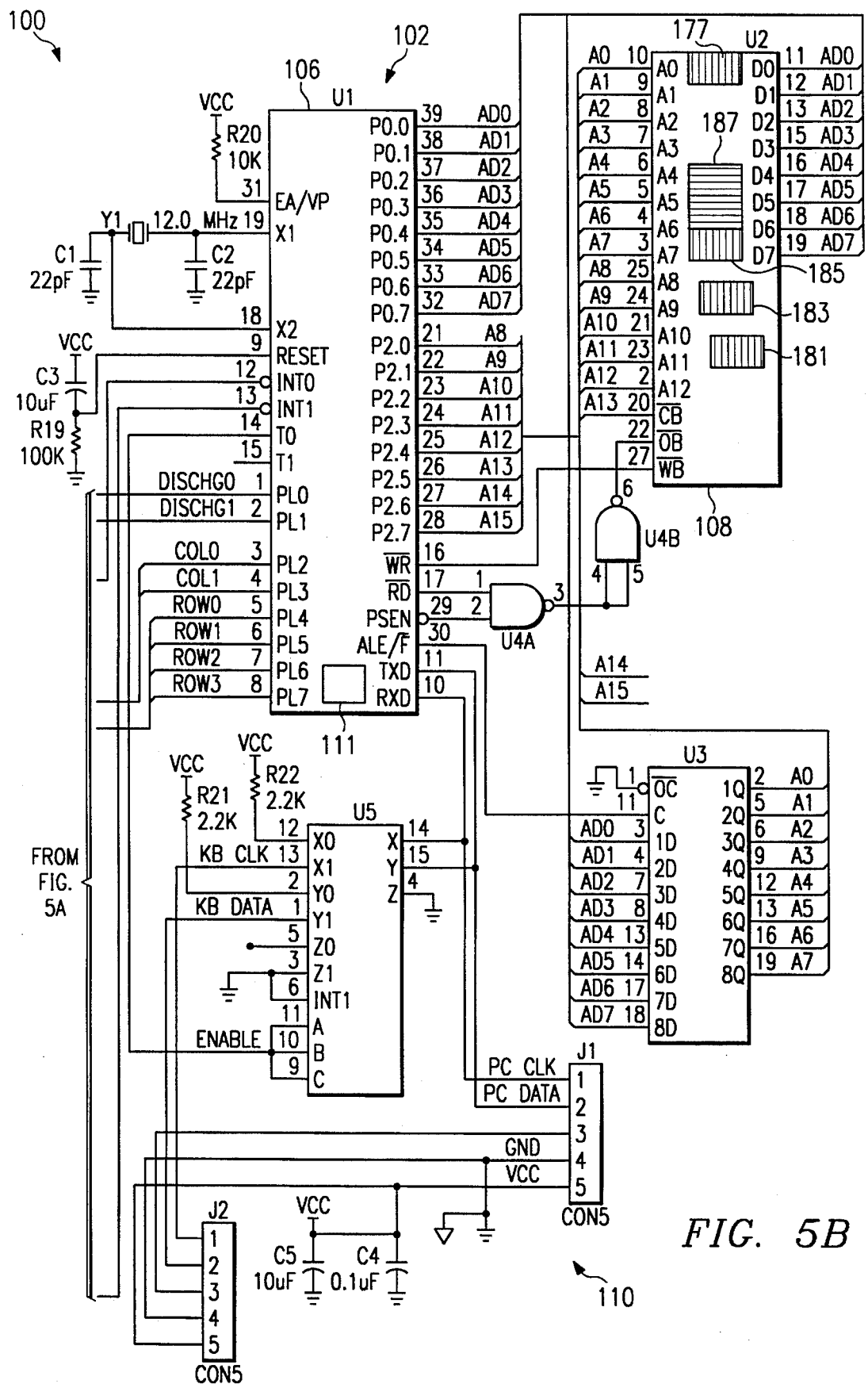

Referring to FIG. 5, a capacitance-sensitive switch array according to a second embodiment of the invention is shown generally at 100. The switch array includes a switch unit control circuit shown generally at 102 and a switch assembly shown generally at 104. The switch unit control circuit includes a microprocessor 106 having eight outputs labelled as DISCHG0, DISCHG1, COL0, COL1, ROW0, ROW1, ROW2, and ROW3 which provide signals by the same names and has two inputs labelled INT0 and INT1 for receiving signals by the same names from the switch assembly 104. The DISCHG1 and DISCHG0 signals act as discharge signals, the COL0 and COL1 signals act as switching signals and the ROW0–3 signals act as selector signals. The INT0 and INT1 signals act as threshold signals.

Further connected to the microprocessor, in the conventional manner is a Random Access Memory RAM 108, and an interface shown generally at 110, the interface being operable to interface the microprocessor to a conventional keyboard port of a conventional personal computer as described in copending U.S. patent application Ser. No. 08/171,716 filed Dec. 22, 1993, incorporated herein by reference.

In this embodiment, the microprocessor 106 is a conventional 87C51 microcontroller which includes an onboard ROM 111 for storing an operating program for controlling the outputs of the microprocessor 106 and for interpreting signals received at the inputs.

The switch assembly 104 includes a plurality of selectable capacitance sensitive switch units shown generally at 112 and individually designated S0–S15. Each switch unit has a respective selector signal input 114, first resistor 116, plate 118 and first diode 120, which function similarly to similar components described with respect to the first embodiment. Therefore, it may be said that each switch unit includes a capacitive element operable to produce a respective effective capacitance dependent upon the physical proximity of objects relative thereto and that each switch unit includes a respective diode operable to discharge a respective effective capacitance. In this embodiment, the ROW0–3 signal lines are connected directly to respective first resistors of respective switch units. Effectively, the microprocessor, the ROW0–3 signal lines, the respective first selector signal inputs and the respective first resistors act as a charging circuit for selectively charging the effective capacitance of each switch unit.

In this embodiment, the switch units 112 are grouped into first, second, third and fourth groups 124, 126, 128 and 130 containing four switch units each. The grouping of the switch units is achieved by connecting together respective cathodes of the first diodes 120 of four switch units to form a common node 122. In addition, the ROW0–3 outputs are connected to respective selector signal inputs of respective switch units in the group, such that each switch unit within a group is individually selectable by activation of its corresponding ROW signal line.

Each switch group 124, 126, 128 and 130 has a second diode 132 connected between its respective common node 122 and a corresponding discharge output of the microprocessor 106. In this embodiment, the first and second groups 124 and 126 share discharge output DISCHG0, while the third and fourth groups 128 and 130 share discharge output DISCHG1. Hence, when the DISCHG0 output is rendered low, the first and second groups 124 and 126 are discharged and when the DISCHG0 output is rendered high, these groups are charged. Similarly with the DISCHG1 signal and the third and fourth groups 128 and 130.

Further connected to the common node 122 of each switch group are respective first, second, third and fourth common switching circuits 134, 136, 138 and 140. Which are operable to selectively connect their common nodes to their respective threshold signal producing circuits in response to the switching signals provided by COL0 and COL1. The first common switching circuit is representative of the second, third and fourth switching circuits and therefore only the first switching circuit 134 will be described.

The first switching circuit 134 includes a switching transistor 142 having a base 144, a collector 146 and an emitter 148. The base connects the transistor to the common node 122, the collector is connected to the COL0 output for receiving the switching signal and the emitter is connected through a third diode 150 to the DISCHG0 output. The third diode is common to the first and second switch groups 124 and 16 and serves to drain any current from these switch groups into the DISCHG0 output when the DISCHG0 signal is active (low). The discharge node is effectively connected in series with the third diode, between the common node and the discharge node. Hence, the first, second and third diodes associated with a given group of switch units act as a discharge control circuit for selectively discharging the effective capacitance of a selected capacitive element in response to the discharge signal provided by the DISCHG0 output.

The emitters 148 of the switching transistors 142 of the first and second switch groups are connected together and are connected to a threshold signal producing circuit 151 for producing a threshold signal (INT0) when the effective capacitance of the selected switch unit charges to a pre-defined potential. The threshold signal producing circuit includes a buffer circuit 152 and a switching element 156.

The buffer circuit 152 is operable to produce a developed potential representing the potential at the selected capacitive element without substantially loading the capacitive element. The buffer circuit includes a transistor 154 having a base 158, a collector 160 and an emitter 162. The base 158 is connected to the emitters 148 of the first and second switching transistors 141, the collector 160 is connected directly to the Vcc power supply and the emitter 161 is connected to signal ground 164 through an impedance 166, which in this embodiment is a 10K resistor. The transistor is configured as an emitter follower circuit and the 10K resistor acts as an impedance across which the developed potential is produced.

The emitter 162 is further connected to first and second inputs 168 and 170 of a schmitt trigger NAND gate 172 wired as an inverter, the NAND gate acting as the switching element 156. The NAND gate has an active low output 174 which is connected to the INT0 input of the microprocessor 106 and, therefore, the NAND gate provides the threshold signal. The third and fourth switch groups 128 and 130 are connected to the microprocessor 101 in a similar manner with the exception that the corresponding NAND gate has an output connected to the INT1 input of the microprocessor. Effectively, therefore, the NAND gate acts as a switching element connected to the impedance, for rendering active the threshold signal when the developed potential is greater than a representative potential representative of the pre-defined potential. As with the first embodiment, a schmitt trigger NAND gate is used to prevent false activation of the threshold signal due to the well-known characteristics of schmitt inputs.

Generally, the switch groups and circuitry are arranged in two banks shown generally at 176 and 178 respectively. Both banks share the COL0, COL1 switching signals, and the ROW0-3 input selector signal lines while the DISCHG0 (discharge) and INT0 (threshold) signal lines are shared by the first and second switch groups 124 and 16 only and the DISCHG1 (discharge) and INT1 (threshold) signal lines are shared by the third and fourth switch groups 128 and 130 only.

Operation of the Switch Array

The general principle of operation of the switch array is as described above in connection with the first embodiment. More particularly, the microprocessor 106 runs a program containing execution codes for implementing a timer routine, a counter routine, a routine for providing the ROW0-3 (input selector), COL0-1 (switching) and DISCHG0-1 (discharge) signals a routine for receiving the INT0-1 (threshold) signals, and a routine for causing a switch status signal to be produced.

FIG. 6

Figure 6:
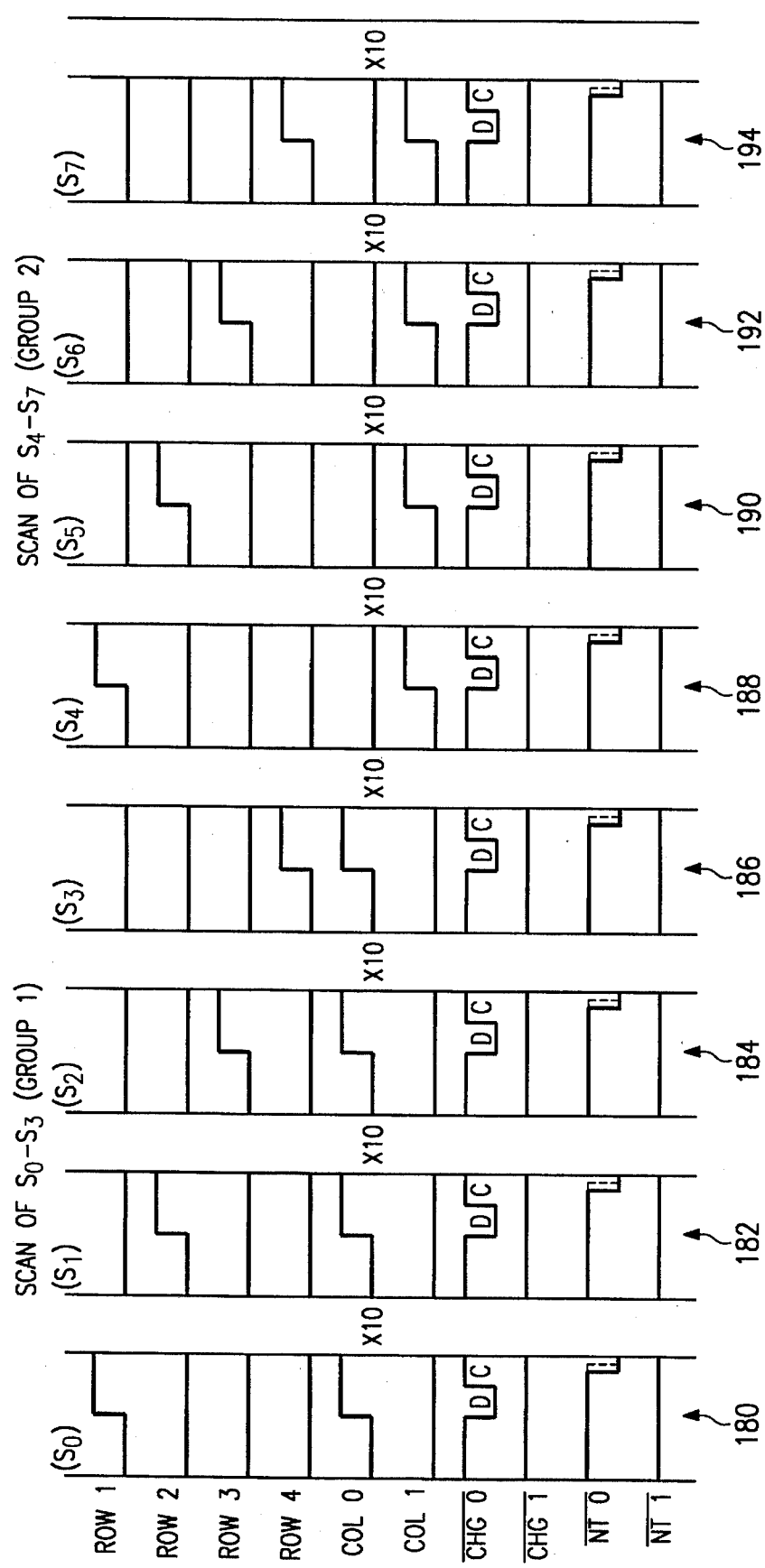
FIG. 6 is a timing diagram illustrating timing relationships between various signals occurring on signal lines shown in FIG. 5.

The routine for providing the ROW0-3 (input selector), COL0-1 (switching) and DISCHG0-1 (discharge) signals is explained with reference to FIG. 6. FIG. 6 illustrates the scanning of each switch unit in the first and second groups 124 and 126 of FIG. 5. It uses eight timing segments 180, 182, 184, 186, 188, 190, 192 and 194 each of which illustrates a basic select, discharge, charge and interrupt cycle for a corresponding switch unit. The first timing segment 180 corresponds to the first switch unit S0, the second timing segment 182 corresponds to the second switch unit S1 and so on up to the eighth timing segment 194 which corresponds to the eighth switch unit S7. Each timing segment is followed by a space with the designator "x10" to indicate that the last half of the preceding segment is repeated ten times in order to acquire an accumulated timer value for the corresponding switch unit.

To begin scanning the array, the first row signal ROW0 is set high while the remaining row signals ROW1-3 are held low, as seen in the first timing segment 180. Referring to FIG. 5, the first switch unit S0 and the ninth switch unit S8 are selected by the ROW0 signal which proceeds to charge the effective capacitance of these switch units. Thus the microprocessor and the respective resistors connected between respective first selector signal inputs and respective capacitive elements act as a charging circuit for selectively charging the effective capacitance of a selected switch unit, each effective capacitance having a respective charging time dependent upon the respective effective capacitance.

Referring to FIG. 6, at the same time as the ROW0 (input selector) signal is activated, the COL0 (switching) signal is rendered active (high) which enables the first and third switching circuits 134 and 138, while the COL1 signal is maintained inactive (low) to maintain disabled the second and fourth switching circuits 136 and 140. Thus the COL0 signal acts as a switching signal for activating the common switching circuit of the first switch group to selectively connect the common node of the first switch group to the threshold signal producing circuit 151.

With the ROW0 and COL0 signal lines active, the DISCHG0 signal line is rendered active (low) while the DISCHG 1 signal line is held inactive (high). This causes the effective capacitance of the first switch unit S0 to be discharged. Since the DISCHG 1 signal is held inactive, the ninth switch unit is not discharged but rather remains charged.

Next the program initiates the timer and counter routines which cause the microprocessor to begin incrementing a timer value as described in connection with the first embodiment. The timer routine acts as a timer cooperating with the charging circuit to produce a timer value indicative of the period of time taken to charge a selected capacitive element from a first pre-defined potential to a second pre-defined potential. Thus, the microprocessor, acting as the switch unit control circuit may be said to include the timer.

The program then renders the DISCHG0 signal inactive (high) which permits the effective capacitance of the first switch unit S0 to be charged. Since the DISCHG1 signal is maintained high, no action occurs at the ninth switch unit and the effective capacitance thereof remains charged. The time required to charge the effective capacitance of the first switch unit S0 to a threshold potential corresponding to the developed potential at which a sufficient potential is developed across the impedance 166 to change the state of the schmitt trigger NAND gate, depends on the effective capacitance being charged. Once this threshold potential has been reached the NAND gate 172 changes state, setting its output 174 active (low) causing the INT0 interrupt signal to appear at the INT0 input of the microprocessor 106. Thus effectively, the DISCHG0 signal acts as a discharge signal which ultimately causes the INT0 signal to be produced by the switch unit, the INT0 signal acting as a threshold signal. It will be appreciated therefore that the threshold signal is rendered active a period of time after the discharge signal is rendered inactive, this period of time being dependent upon the effective capacitance of the associated plate of the associated switch unit.

The microprocessor 106 responds to the INT0 signal by stopping the timer routine and checking to see if the counter value is equal to ten as described with respect to the first embodiment. If not, any remaining charging and discharging cycles are repeated and the successively acquired timer values are accumulated until ten charging and discharging cycles have been completed, as indicated by the counter value. The counter value is incremented each time a discharging/charging cycle has been completed. The timer routine includes an accumulator which, in this embodiment includes a memory register 177 in the RAM, for accumulating the timer values produced over a succession of periods of time to produce an accumulated timer value.

When the accumulated timer value for a succession of ten discharge/charge cycles has been acquired, this value is compared to a reference timer value previously stored in a corresponding reference timer value memory register 185 in the RAM 108. Thus, the switch control unit includes a storage circuit for storing a corresponding reference accumulated timer value for each switch unit. Each corresponding reference accumulated timer value represents the timer value obtained when no object is in close proximity with the corresponding capacitive element. If the presently acquired timer value is excessively greater than the reference timer value, it is assumed that there is an object in close proximity to the plate 118. On the other hand, if the presently acquired value is about the same as the reference value it is assumed that there are no objects in close proximity with the plate 118. Comments provided above with respect to numerical values for the terms excessively greater and approximately the same are also applicable here.

The status of objects relative to the plate is indicated by the switch status signal which, in this embodiment, is reflected in a bit stored in a designated bit position of a first switch status byte stored in a first switch status memory register 181 the RAM 108. The switch status byte has eight bit positions, each bit position corresponding to the status of objects in proximity to the plate of a respective switch unit S0–S7. Thus the microprocessor acts as a switch status signal producing circuit cooperating with the timer routine to produce a switch status signal for a selected switch element, the switch status signal being indicative of the physical proximity of an object relative to the selected capacitive element, the switch status signal producing circuit comparing the timer value with a corresponding reference timer value and rendering the switch status signal active when the timer value is greater than the corresponding reference accumulated timer value and rendering the switch status signal inactive when the timer value is equal to or less than the corresponding reference accumulated timer value.

After completing the first timing segment 180, repeating it ten times and updating the corresponding bit position in the switch status byte, the first row signal ROW0 is set inactive (low) and the second row signal line ROW1 is set active (high) and the process of enabling the COL0 line while holding the COL1 line inactive and raising and lowering the DISCHG0 signal line to acquire an accumulated timer value for the second switch unit S1 is performed as illustrated by timing segment 182. A second switch status bit in the switch status byte, corresponding to the second switch unit S1 is then updated. This process is then repeated for the third and fourth switch units S2 and S3 in the first group 124, as described by timing segments 184 and 286 respectively. In this manner, each of the four switch units S0–S3 in the first switch group 124 is successively scanned and the corresponding switch status bits updated.

After the first group 124 has been scanned, a similar process is performed on the second group 126 as indicated by timing segments 188–194. These timing segments are generally the same as the timing segments for the first group, with the exception that the COL0 line is held inactive (low) while the COL2 line is made to follow the sequence labelled COL0 in FIG. 6. In this manner, each of the four switch units S4–S7 in the second switch group 126 is successively scanned and the corresponding switch status bits updated.

After the first and second groups 124 and 126 have been scanned, the third and fourth groups 128 and 130 are scanned by rendering the ROW0–3 and COL0–1 signals active and inactive as described in connection with groups one and two, however, the DISCHGD signal is held inactive (high) while the DISCHG1 signal is made to follow the sequence labelled DISCHG0 in FIG. 6. In this manner a second switch status byte having bit positions corresponding to respective switch units S8–S15, is updated with status bits indicating the proximity of objects relative to respective plates. The second switch status byte is stored in a second switch status memory register 183 in the RAM 108.

By reading the contents of a given bit position in the first or second switch status memory registers the microprocessor 106 can quickly determine the status of any given switch unit S0–S15.

It will be appreciated that before the apparatus can be used reference values for each of the switch units must be stored in respective reference timer value memory registers. Thus, in this embodiment, there are sixteen eight-bit reference value memory registers 187 in FIG. 5, each corresponding to a respective switch unit. To load the reference value memory registers, the program includes a calibrate routine which allows a user to enter a calibrate mode whereby the user ensures that no objects are in physical proximity with any of the plates and after a pre-determined time, accumulated timer values representing the case where no objects are in physical proximity with respective plates are acquired and stored in the reference value memory registers. After such values have been stored, the program exits the calibrate mode and is ready to acquire timer values as described above. One way to enter the calibrate routine is to cause the program to detect a given key sequence and enter the calibrate routine when such a key sequence is entered. One advantage of this is that the array can be easily recalibrated at any time.

Generally, the operation of the switch array can be described as a method of operating a capacitance-sensitive switch array, the method comprising the steps of sequentially charging respective effective capacitances of a plurality of addressable capacitance sensitive switch units each having a capacitive element operable to produce a respective effective capacitance dependent upon the physical proximity of objects relative thereto, each respective effective capacitance having a respective charging time dependent on said respective effective capacitance, producing a plurality of respective timer values indicative of the time taken to charge each respective capacitive element from a first pre-defined potential to a second pre-defined potential, and comparing each respective timer value with a respective reference timer value and rendering a switch status signal active when said respective timer value is greater than said reference timer value and rendering said switch status signal inactive when said timer value is equal to or less than said respective reference timer value.

The switch array can be employed in a manner similar to that described with respect to FIGS. 3 and 4 where, for example, the array is provided in a linear manner immediately adjacent the conventional function keys on a conventional personal computer. Individual plates may then be identified with respective functions and such functions may be incorporated into the program executed by the microprocessor 106. In addition the microprocessor 106 may be the same microprocessor which is conventionally used to encode keystrokes into codes recognizable to a host computer. Thus, the conventional keyboard processor can incorporate the additional functionality of the switch array allowing compact integration of the switch array into a conventional computer keyboard.

While specific embodiments of the invention have been described and illustrated, such embodiments should be considered illustrative of the invention only and not as limiting the invention as construed in accordance with the accompanying claims.

What is claimed is:

1. A capacitive-sensitive switch unit comprising:
   a) a capacitive element operable to product an effective capacitance dependent upon the physical proximity of objects relative thereto;
   b) a first selector signal input connected to the capacitive element to enable a first input signal to charge the effective capacitance;
   c) a threshold signal producing circuit connected to the capacitive element, for producing a threshold signal which is rendered active when said effective capacitance charges to a pre-defined potential;
   d) a switching circuit for selectively connecting a capacitive element to the threshold signal producing circuit in response to a switching signal;
   e) a discharge control circuit connected to the capacitive element, for selectively discharging the effective capacitance independently of the input signal to set said capacitive element to a predetermined voltage, in response to a discharge signal; and
   f) a timer for measuring the time period from a start of charging said capacitive element to the time at which said threshold signal becomes active.

2. An apparatus as claimed in claim 1 wherein said capacitive element includes a sheet conductor.

3. An apparatus as claimed in claim 1 wherein said first selector signal input includes a first resistor.

4. A capacitive-sensitive switch unit comprising:
   a) a capacitive element operable to produce an effective capacitance dependent upon the physical proximity of objects relative thereto;
   b) a first selector signal input connected to the capacitive element to enable a first input signal to charge the effective capacitance;
   c) a threshold signal producing circuit connected to the capacitive element for producing a threshold signal which is rendered active when said effective capacitance charges to a pre-defined potential; wherein said threshold signal producing circuit includes a buffer circuit for producing a developed potential representing the potential at said capacitive element without substantially loading said capacitive element;
   d) a switching circuit for selectively connecting a capacitive element to the threshold signal producing circuit in response to a switching signal; and
   e) a discharge control circuit connected to the capacitive element for selectively discharging the effective capacitance independently of the input signal, in response to a discharge signal.

5. An apparatus as claimed in claim 4 wherein said buffer circuit includes an emitter follower circuit including an impedance across which said developed potential is produced.

6. An apparatus as claimed in claim 5 wherein said threshold signal producing circuit includes a switching element for rendering active said threshold signal when said developed potential is greater than a representative potential representative of said pre-defined potential.

7. An apparatus as claimed in claim 6 wherein said switching element includes a schmitt trigger circuit for reducing false activation of said threshold signal producing circuit.

8. A capacitive-sensitive switch unit comprising:
   a) a capacitive element operable to product an effective capacitance dependent upon the physical proximity of objects relative thereto;
   b) a first selector signal input connected to the capacitive element to enable a first input signal to charge the effective capacitance;
   c) a threshold signal producing circuit connected to the capacitive element for producing a threshold signal which is rendered active when said effective capacitance charges to a pre-defined potential;
   d) a switching circuit for selectively connecting a capacitive element to the threshold signal producing circuit in response to a switching signal; wherein said switching circuit includes a transistor having a base, a collector and an emitter, said base being connected to said capacitive element, said collector being operable to receive said switching signal and said emitter being connected to said threshold signal producing circuit; and e) a discharge control circuit connected to the capacitive element for selectively discharging the effective capacitance independently of the input signal in response to a discharge signal.

9. An apparatus as claimed in claim 1 wherein said discharge control circuit includes first and second diodes connected in series, the first diode being connected to said capacitive element and the second diode being connected to a discharge node having a potential controlled by said discharge signal.

10. An apparatus as claimed in claim 1 further including a switch unit control circuit for producing said input signal, said switching signal and said discharge signal to cause said threshold signal producing circuit to render active said threshold signal immediately following a period of time after said discharge signal is rendered inactive, said period of time being dependent upon said effective capacitance.

11. An apparatus as claimed in claim 10 wherein said switch control circuit includes a timer for producing a timer value indicative of said period of time.

12. An apparatus as claimed in claim 11 wherein said switch control circuit includes a switch status signal producing circuit for rendering active a switch status signal when said timer value is greater than a stored timer value.

13. An apparatus as claimed in claim 12 wherein said stored timer value represents the timer value obtained when no objects are in close physical proximity to said capacitive element.

14. An apparatus as claimed in claim 13 further including a storage circuit for storing the timer value produced when no objects are in close physical proximity to said capacitive element.

15. An apparatus as claimed in claim 11 wherein said switch unit control circuit includes a timer value accumulator for accumulating the timer values produced over a succession of said periods of time to produce an accumulated timer value.

16. An apparatus as claimed in claim 15 wherein said switch control circuit includes a switch status signal producing circuit for rendering active a switch status signal when said accumulated timer value is greater than an accumulated stored timer value.

17. An apparatus as claimed in claim 16 wherein said accumulated stored timer value represents the accumulated timer value obtained after a succession of said periods of time, when no objects are in close physical proximity to said capacitive element.

18. An apparatus as claimed in claim 17 further including a storage circuit for storing the accumulated timer value produced when no objects are in close physical proximity to said capacitive element.

19. An apparatus as claimed in claim 18 wherein said switch unit control circuit includes a microprocessor and said storage circuit includes a memory register.

20. A capacitance-sensitive switch unit comprising:

a) a capacitive element operable to produce an effective capacitance dependent upon the physical proximity of objects relative thereto;

b) a first selector signal input connected to the capacitive element to enable a first input signal to charge the effective capacitance, said first selector signal input including a first resistor connected to said capacitive element;

c) a threshold signal producing circuit connected to the capacitive element, for producing a threshold signal which is rendered active when said effective capacitance charges to a pre-defined potential, said threshold signal producing circuit including:
  i) a buffer circuit for producing a developed potential representing the potential at said capacitive element without substantially loading said capacitive element, said buffer circuit including an emitter follower circuit including a resistor across which said developed potential is produced; and
  ii) a switching element for rendering active said threshold signal when said developed potential is greater than a representative potential representative of said pre-defined potential, said switching element including a schmitt trigger circuit for reducing false activation of said threshold circuit;

d) a discharge control circuit connected to the capacitive element, for selectively discharging the effective capacitance independently of the input signal, in response to a discharge signal received by said discharge control circuit, said discharge control circuit including first and second diodes connected in series, the first diode being connected to said capacitive element and the second diode being connected to a discharge node having a potential controlled by said discharge signal, such that at least some discharge current from said capacitive element is operable to flow through said first and second diodes into said discharge node; and e) a switching circuit for selectively connecting the capacitive element to the threshold signal producing circuit in response to a switching signal received by said switching circuit, said switching circuit including a transistor having a base, a collector and an emitter, said base being connected between said first and second diodes, said collector being operable to receive said switching signal and said emitter being connected to said threshold signal producing circuit.

21. An apparatus as claimed in claim 20 further including a third diode connected between the emitter of said transistor and said discharge node such that current can flow through said diode into said discharge node.

22. An apparatus as claimed in claim 21 further including a swamping capacitor for swamping the capacitance of said third diode.

23. An apparatus as claimed in claim 20 wherein said capacitive element includes a sheet conductor.

24. A method of operating a capacitive-sensitive switch unit, the method comprising the steps of:

a) producing an effective capacitance in a capacitive element having an effective capacitance dependent on the physical proximity of objects relative thereto;

b) charging the effective capacitance with a first selector signal;

c) selectively connecting the capacitive element to a threshold signal producing circuit in response to a switching signal;

d) rendering active a threshold signal when said effective capacitance charges to a pre-defined voltage;

e) selectively discharging the effective capacitance independently of the input signal, in response to a discharge signal; and f) measuring the time from a start of charging said capacitive element to the rendering active of said threshold signal and comparing said measured time to a reference time.

25. A switch array comprising:
   a) a plurality of selectable capacitance-sensitive switch units, each switch unit including a capacitive element operable to produce a respective effective capacitance dependent upon the physical proximity of objects relative thereto;
   b) a charging circuit for selectively charging the effective capacitance of each switch unit, each respective effective capacitance having a respective charging time dependent on said respective effective capacitance;
   c) a timer cooperating with said charging circuit for producing a timer value indicative of the period of time taken to charge a selected capacitive element from a first pre-defined potential to a second pre-defined potential; and
   d) a switch status signal producing circuit cooperating with said timer to produce a switch status signal for a selected switch element, said switch status signal being indicative of the physical proximity of an object relative to the selected capacitive element, said switch status signal producing circuit comparing said timer value with a corresponding reference timer value and rendering said switch status signal active when said timer value is greater than said corresponding reference timer value and rendering said switch status signal inactive when said timer value is equal to or less than said corresponding reference timer value.

26. An apparatus as claimed in claim 25 wherein said charging circuit includes, for each switch unit, a first selector signal input and a resistor connected between said first selector signal input and said capacitive element.

27. An apparatus as claimed in claim 26 wherein said charging circuit includes a microprocessor for providing an input selector signal operable to charge the effective capacitance of a selected switch unit.

28. An apparatus as claimed in claim 27 wherein said microprocessor includes a direct connection to said resistor.

29. An apparatus as claimed in claim 25 wherein each of said switch units includes a respective diode operable to discharge said respective effective capacitance.

30. An apparatus as claimed in claim 29 wherein the diodes of a plurality of switch units are connected together at a common node.

31. An apparatus as claimed in claim 30 further including a threshold signal producing circuit for producing a threshold signal when the effective capacitance of said selected switch unit charges to a pre-defined potential.

32. An apparatus as claimed in claim 31 further including a common switching circuit for selectively connecting said common node to said threshold signal producing circuit in response to a switching signal.

33. An apparatus as claimed in claim 32 wherein said switching circuit includes a transistor having a base, a collector and an emitter, said base being connected to said common node, said collector being operable to receive said switching signal and said emitter being connected to said threshold signal producing circuit.

34. An apparatus as claimed in claim 31 wherein said threshold signal producing circuit includes a buffer circuit for producing a developed potential representing the potential at said selected capacitive element without substantially loading said selected capacitive element.

35. An apparatus as claimed in claim 34 wherein said buffer circuit includes an emitter follower circuit including an impedance across which said developed potential is produced.

36. An apparatus as claimed in claim 34 wherein said threshold signal producing circuit includes a switching element connected to said impedance for rendering active said threshold signal when said developed potential is greater than a representative potential representative of said pre-defined potential.

37. An apparatus as claimed in claim 36 wherein said switching element includes a schmitt trigger circuit for reducing false activation of said threshold circuit.

38. An apparatus as claimed in claim 32 further including a discharge control circuit connected to the common node, for selectively discharging the effective capacitance of said selected capacitive element in response to a discharge signal.

39. An apparatus as claimed in claim 38 wherein said discharge control circuit includes a discharge node and a diode connected in series, between said common node and said discharge node, said discharge node having a potential controlled by said discharge signal.

40. An apparatus as claimed in claim 39 further including a switch unit control circuit for:
   a) providing an input selector signal operable to charge the effective capacitance of a desired switch unit;
   b) providing said switching signal; and
   c) providing said discharge signal to cause said threshold signal producing circuit to render active said threshold signal a period of time after said discharge signal is rendered inactive, said period of time being dependent upon said effective capacitance.

41. An apparatus as claimed in claim 40 wherein said switch control circuit includes a microprocessor having:
   a) outputs operable to produce said input selector signal, said switching signal and said discharge signal;
   b) an input for receiving said threshold signal;
   c) execution codes for implementing said timer and for causing said switch status signal to be produced.

42. An apparatus as claimed in claim 40 wherein said switch unit control circuit includes said timer.

43. An apparatus as claimed in claim 40 wherein said switch control circuit includes a storage circuit for storing a corresponding reference timer value for each switch unit.

44. An apparatus as claimed in claim 43 wherein a given corresponding reference timer value represents the timer value obtained when no objects are in close physical proximity to the corresponding capacitive element.

45. An apparatus as claimed in claim 40 wherein said switch unit control circuit includes a timer value accumulator for accumulating the timer values produced over a succession of said periods of time to produce an accumulated timer value.

46. An apparatus as claimed in claim 45 further including a storage circuit for storing a corresponding reference accumulated timer value for each switch unit, each said reference accumulated timer value representing the accumulated timer value produced when no object is in close physical proximity to the corresponding capacitive element.

47. An apparatus as claimed in claim 46 wherein said switch control circuit renders active said switch status signal when the accumulated timer value of a selected switch unit is greater than its corresponding reference accumulated timer value.

48. An apparatus as claimed in claim 46 wherein said switch unit control circuit includes a microprocessor and said storage circuit includes a memory register.

49. A method of operating a capacitance-sensitive switch array, the method comprising the steps of:
   a) sequentially charging respective effective capacitances of a plurality of addressable capacitance sensitive switch units each having a capacitive element operable to produce a respective effective capacitance dependent upon the physical proximity of objects relative thereto, each respective effective capacitance having a respective charging time dependent on said respective effective capacitance;

b) producing a plurality of respective timer values indicative of the time taken to charge each respective capacitive element from a first pre-defined potential to a second pre-defined potential; and c) comparing each respective timer value with a respective reference timer value and rendering a switch status signal active when said respective timer value is greater than said reference timer value and rendering said switch status signal inactive when said timer value is equal to or less than said respective reference timer value.

50. A switch array comprising:

a) a plurality of selectable capacitance-sensitive switch units, each switch unit including a capacitive element operable to produce a respective effective capacitance dependent upon the physical proximity of an object relative thereto, a diode connected to said capacitive element such that current is operable to be conducted from the capacitive element by the diode, and a selector signal input connected to the capacitive element to enable a respective input signal to charge the corresponding effective capacitance, said switch units being divided into respective groups of switch units, the diodes of each switch unit in a given group being connected together at a common node;

b) at least one threshold signal producing circuit for each two groups of switch units, for producing a threshold signal which is rendered active when the effective capacitance of a selected switch unit charges to a pre-defined potential;

c) a plurality of switching circuits, one switching circuit for each group of switch units, for selectively connecting the corresponding group of switch units to the threshold signal producing circuit in response to switching signals;

d) a plurality of discharge control circuits, one for each two groups of switch units, each said discharge control circuit including a common discharge node and a respective diode connected between said common node and said discharge node for draining current from said common node to said discharge node, said discharge node being operable to receive a discharge signal;

e) a control circuit for:
i) selectively providing said input signal to a selected switch unit such that said input signal is operable to charge the effective capacitance of said selected switch unit, said effective capacitance having a respective charging time dependent on said effective capacitance;

ii) selectively providing said switching signal to said switching circuit to connect the group of switch units of which the selected switch unit is a member to the threshold signal producing circuit;

iii) selectively providing said discharge signal to said discharge node to selectively discharge said effective capacitance to a first pre-defined potential;

iv) receiving said threshold signal;

v) producing a timer value indicative of the period of time taken to charge said selected capacitive element from said first pre-defined potential to a second pre-defined potential by starting a timer upon rendering said discharge signal inactive and stopping said timer when said threshold signal is rendered active; and for vi) producing a switch status signal for the selected switch element, said switch status signal producing circuit comparing said timer value with a corresponding reference timer value and rendering said switch status signal active when said timer value is greater than said corresponding reference timer value and rendering said switch status signal inactive when said timer value is equal to or less than said corresponding reference timer value.

51. An apparatus as claimed in claim 50 wherein said control circuit includes a microprocessor.

52. An apparatus as claimed in claim 50 wherein each switching circuit includes a transistor having a base, a collector and an emitter, said base being connected to said common node, said collector being operable to receive said switching signal and said emitter being connected to said threshold signal producing circuit.

53. An apparatus as claimed in claim 52 wherein each said threshold signal producing circuit includes a respective buffer circuit for producing a developed potential representing the potential at said selected capacitive element without substantially loading said selected capacitive element.

54. An apparatus as claimed in claim 53 wherein said buffer circuit includes an emitter follower circuit including an impedance across which said developed potential is produced.

55. An apparatus as claimed in claim 54 wherein said threshold signal producing circuit includes a switching element connected to said impedance for rendering active said threshold signal when said developed potential is greater than a representative potential representative of said pre-defined potential.

56. An apparatus as claimed in claim 55 wherein said switching element includes a schmitt trigger circuit for reducing false activation of said threshold circuit.

57. An apparatus as claimed in claim 50 wherein said switch control circuit includes a storage circuit for storing a corresponding reference timer value for each switch unit.

58. An apparatus as claimed in claim 57 wherein a given corresponding reference timer value represents the timer value obtained when no object is in close physical proximity to the corresponding capacitive element.

59. An apparatus as claimed in claim 50 wherein said switch unit control circuit includes a timer value accumulator for accumulating successive timer values to produce an accumulated timer value.

60. An apparatus as claimed in claim 59 further including a storage circuit for storing a corresponding reference accumulated timer value for each switch unit, each said reference accumulated timer value representing the accumulated timer value produced when no object is in close physical proximity to the corresponding capacitive element.

61. An apparatus as claimed in claim 60 wherein said control circuit renders active said switch status signal when the accumulated timer value of a selected switch unit is greater than its corresponding reference accumulated timer value.

62. A capacitance-sensitive switch unit, comprising:
(a) a capacitive element operable to produce an effective capacitance dependent upon the physical proximity of objects relative thereto and the voltage on said capacitive element changes at a rate due to said effective capacitance;

(b) a first signal input terminal connected to said capacitive element to enable a first input signal to charge said effective capacitance, (c) a threshold detector circuit, (d) a switching signal terminal for receiving a switching signal for selectively coupling said capacitive element to an input terminal of said threshold detector circuit, (e) said threshold detector circuit for producing a switch unit signal having an active state when said capacitive element is coupled to said threshold detector circuit and the voltage at said input terminal reaches a pre-defined voltage; and (f) a timer for measuring a charge transition time for said capacitive element form an initial state to said pre-defined voltage for reference to a predetermined time.

63. A method of operation for a capacitance-sensitive switch unit, comprising the steps of:

(a) producing an effective capacitance in a capacitive element having said effective capacitance dependent on the physical proximity of objects relative thereto and wherein the voltage on said capacitive element changes at a rate due to said effective capacitance;

(b) setting a first voltage on said capacitive element, (c) coupling said capacitive element to an input terminal of a threshold detector which has a threshold voltage, (d) producing a time count to measure the time from a start of changing the voltage on said capacitive element until the voltage at said input terminal of said threshold detector reaches said threshold voltage, and (e) comparing said time count to a reference count to produce a switch state for said capacitance-sensitive switch unit.

64. A method of operation for a capacitance-sensitive switch unit as recited in claim 63 wherein said step of comparing said time count comprises comparing a series of said time counts to said reference count.

* * * * *